United States Patent
Liang et al.

(10) Patent No.: US 9,263,275 B2
(45) Date of Patent: Feb. 16, 2016

(54) INTERFACE FOR METAL GATE INTEGRATION

(71) Applicant: Taiwan Semiconductor Manufacturing Company, Ltd., Hsin-Chu (TW)

(72) Inventors: Jinn-Kwei Liang, Yongkang (TW); Chung-Ren Sun, Kaohsiung (TW); Shiu-Ko Jang Jiang, Tainan (TW); Hsiang-Hsiang Ko, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/796,576

(22) Filed: Mar. 12, 2013

(65) Prior Publication Data

US 2014/0264478 A1    Sep. 18, 2014

(51) Int. Cl.
  *H01L 29/66* (2006.01)
  *H01L 21/28* (2006.01)
  *H01L 29/49* (2006.01)
  *H01L 29/51* (2006.01)

(52) U.S. Cl.
  CPC .... *H01L 21/28079* (2013.01); *H01L 21/28088* (2013.01); *H01L 29/4958* (2013.01); *H01L 29/4966* (2013.01); *H01L 29/6659* (2013.01); *H01L 29/66545* (2013.01); *H01L 29/517* (2013.01)

(58) Field of Classification Search
  CPC ........ H01L 29/66545; H01L 21/823807; H01L 29/7848; H01L 21/823814; H01L 21/823842; H01L 29/78; H01L 29/4966; H01L 29/517; H01L 29/6659; H01L 29/66636; H01L 29/7833; H01L 21/28088; H01L 21/28; H01L 29/665; H01L 29/6656
  USPC .................................. 257/288; 438/299, 585
  See application file for complete search history.

(56) References Cited

U.S. PATENT DOCUMENTS

| | | | |
|---|---|---|---|
| 6,156,661 A | 12/2000 | Small | |
| 6,373,111 B1 | 4/2002 | Zheng et al. | |
| 6,546,939 B1 | 4/2003 | Small | |
| 7,517,766 B2 * | 4/2009 | Chou et al. | 438/303 |
| 7,977,181 B2 * | 7/2011 | Lai et al. | 438/199 |
| 8,084,311 B1 | 12/2011 | Horak et al. | |
| 8,436,404 B2 * | 5/2013 | Bohr et al. | 257/288 |
| 2004/0183091 A1 | 9/2004 | Hibino | |
| 2005/0106887 A1 | 5/2005 | Chen et al. | |
| 2005/0202666 A1 | 9/2005 | Yang et al. | |
| 2006/0024517 A1 | 2/2006 | Doan et al. | |
| 2006/0217830 A1 | 9/2006 | Saki et al. | |
| 2007/0014915 A1 | 1/2007 | Nishiura et al. | |
| 2008/0020578 A1 | 1/2008 | Auer et al. | |
| 2008/0261399 A1 | 10/2008 | Choi et al. | |
| 2009/0072238 A1 * | 3/2009 | Yamazaki et al. | 257/72 |

(Continued)

*Primary Examiner* — Monica D Harrison
(74) *Attorney, Agent, or Firm* — Haynes and Boone, LLP

(57) ABSTRACT

A metal oxide semiconductor field effect transistor (MOSFET) includes a semiconductor substrate and a interlayer dielectric (ILD) over the semiconductor substrate. A gate structure is formed within the ILD and disposed on the semiconductor substrate, wherein the gate structure includes a high-k dielectric material layer and a metal gate stack. One or more portions of a protection layer are formed over the gate stack, and a contact etch stop layer is formed over the ILD and over the one or more portions of the protection layer. The metal gate stack includes aluminum and the protection layer includes aluminum oxide.

20 Claims, 4 Drawing Sheets

(56) References Cited

U.S. PATENT DOCUMENTS

| | | |
|---|---|---|
| 2009/0294776 A1 | 12/2009 | Soukiassian et al. |
| 2009/0321877 A1 | 12/2009 | Wang |
| 2010/0038687 A1* | 2/2010 | Klaus et al. .................. 257/288 |
| 2010/0164002 A1 | 7/2010 | Golonzka et al. |
| 2011/0193144 A1* | 8/2011 | Sun et al. ..................... 257/288 |
| 2012/0068234 A1 | 3/2012 | Soss et al. |
| 2012/0161322 A1 | 6/2012 | Wakayanagi et al. |
| 2012/0241873 A1* | 9/2012 | Huang .......................... 257/410 |
| 2012/0261676 A1 | 10/2012 | Nakano |
| 2012/0315762 A1 | 12/2012 | Jiang et al. |
| 2013/0026579 A1 | 1/2013 | Lu et al. |
| 2013/0040450 A1 | 2/2013 | Xie et al. |
| 2013/0049168 A1 | 2/2013 | Yang et al. |
| 2013/0049924 A1 | 2/2013 | Yang et al. |
| 2013/0078780 A1 | 3/2013 | Lin et al. |
| 2013/0098395 A1 | 4/2013 | Ding et al. |
| 2013/0105903 A1* | 5/2013 | Chang et al. .................. 257/369 |
| 2013/0105912 A1 | 5/2013 | Hsu et al. |
| 2013/0161754 A1 | 6/2013 | Su et al. |
| 2013/0187203 A1 | 7/2013 | Xie et al. |
| 2013/0234292 A1 | 9/2013 | Wei et al. |
| 2013/0264616 A1 | 10/2013 | Wang et al. |
| 2013/0277767 A1 | 10/2013 | Li et al. |
| 2013/0313561 A1 | 11/2013 | Suh |
| 2013/0320411 A1* | 12/2013 | Fan et al. ..................... 257/288 |
| 2013/0320412 A1 | 12/2013 | Yamasaki |
| 2013/0320414 A1 | 12/2013 | Fan et al. |
| 2014/0012650 A1 | 1/2014 | Faulkner et al. |
| 2014/0020712 A1 | 1/2014 | Benson |
| 2014/0027857 A1 | 1/2014 | Yin et al. |
| 2014/0073039 A1 | 3/2014 | Chang et al. |
| 2014/0099784 A1 | 4/2014 | Kim et al. |
| 2014/0103403 A1 | 4/2014 | Kim et al. |
| 2014/0154846 A1 | 6/2014 | Cheng et al. |

* cited by examiner

INTERFACE FOR METAL GATE INTEGRATION

BACKGROUND

In advanced technology nodes of integrated circuit industry, high k dielectric material and metal are adopted to form a gate stack of a field-effect transistor (FET) such as a metal-oxide-semiconductor field-effect transistors (MOSFETs). Metal gate stacks are often planarized, such as by chemical-mechanical polishing (CMP), and then covered with a contact etch-stop layer (CESL). Additional processing operations are then performed, including forming an interlayer dielectric (ILD) above the metal gate stack, and then patterning and forming a contact through the ILD. As a result of these additional processing operations, it has been found that damage sometimes occurs to the metal gate stacks. For example, an acid solvent can reach the metal gate stack and adversely affect the gate stack, such as by forming a void or other defect. It is desired to maintain the integrity of the metal gate stack throughout the various processes.

It is also desired to maintain high production efficiency, adding to maintain or reduce the number of processing operations and processing tools used to fabricate devices such as MOSFETs. Therefore, an improved interface for a metal gate stack and a method making the same are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
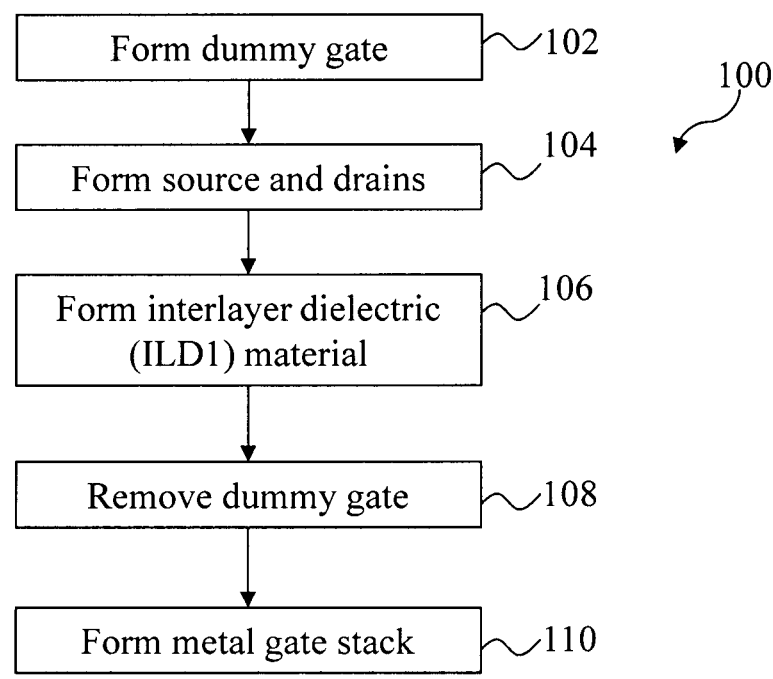
FIGS. 1 and 3 are a flowchart of a method for making a semiconductor device having a metal gate stack constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
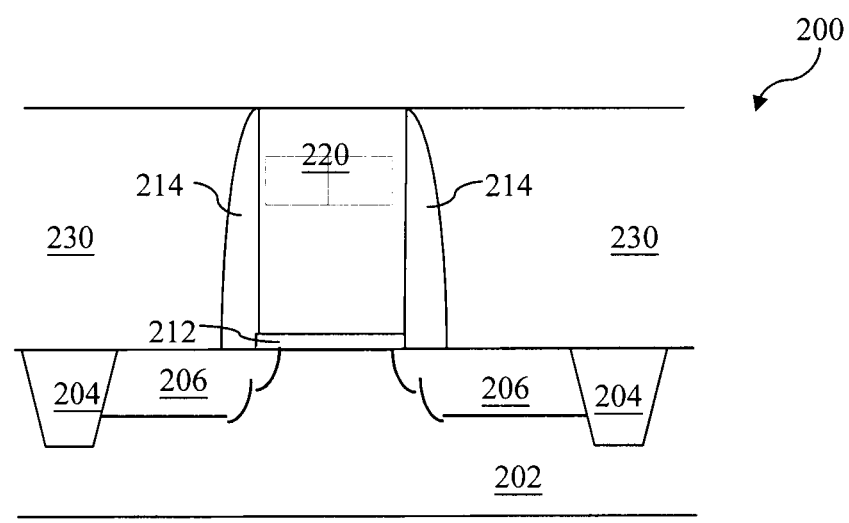
FIGS. 2, 4, and 5 are sectional views of a semiconductor device having a metal gate stack at various fabrication stages constructed according to various aspects of the present disclosure in one or more embodiments.

FIG. 1 is a flowchart of one embodiment of a dummy-gate method 100 for use in making a semiconductor device having a gate stack constructed according to aspects of the present disclosure. FIG. 2 provides a sectional view of one embodiment of a semiconductor structure 200 having a gate stack at various fabrication stages. The semiconductor structure 200 and the method 100 of making the same are collectively described with reference to FIGS. 1 and 2. It is understood that a dummy gate (or gate-last) process is described as an exemplary embodiment, which is not intended to be limiting except and unless as explicitly recited in the claims.

The method 100 begins at step 102 by providing a semiconductor substrate 202. The semiconductor substrate 202 includes silicon. Alternatively, the substrate 202 includes germanium or silicon germanium. In other embodiments, the substrate 202 may use another semiconductor material such as diamond, silicon carbide, gallium arsenic, GaAsP, AlInAs, AlGaAs, GaInP, or other proper combination thereof.

The semiconductor substrate also includes various doped regions such as n-well and p-wells formed by a proper technique, such as ion implantation. The semiconductor substrate 202 also includes various isolation features, such as shallow trench isolation (STI) 204, formed in the substrate to separate various devices. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

Continuing with the present embodiment, a high k dielectric material layer 212 is formed on the semiconductor substrate 202. The high-k dielectric layer 212 includes a dielectric material having the dielectric constant higher than that of thermal silicon oxide, about 3.9. The high k dielectric material layer 212 is formed by a suitable process such as ALD. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer includes metal nitrides, metal silicates or other metal oxides. In addition, an interfacial layer may be formed between the high-k dielectric material layer 212 and the substrate 202.

A polysilicon layer 220 is formed above the high-k dielectric material layer 212. The polysilicon layer 220 is formed by a proper technique, such as CVD. In one example, the polysilicon layer 220 is non-doped. In another example, the polysilicon layer 220 has a thickness between about 500 angstrom and about 1000 angstrom.

The polysilicon layer 220 is patterned, as shown in FIG. 2. Patterning the polysilicon layer 220 can be performed in various manners, such as by using a patterned mask, followed by an etch process. In the present embodiment, the gate dielectric 212 is also patterned. As a result, a dummy gate is formed, as shown in FIG. 2.

Execution proceeds to step 104, in which source and drain features 206 are formed in the substrate 202. In the present embodiment, a gate spacer 214 is formed on the sidewalls of the dummy gate 220. The gate spacer 214 includes one or more dielectric material, such as silicon oxide, silicon nitride, silicon oxynitride or combinations thereof. The source and drain 206 include doping species introduced to the semiconductor substrate 202 by a proper technique, such as ion implantation. In one embodiment, the gate stack is configured in the active region for an n-type field effect transistor (nFET), and the dopant of the source and drain is n-type dopant, such as phosphorus or arsenic. In another embodiment, the gate stack is configured in the active region for a p-type field effect transistor (pFET), and the dopant of the source and drain is p-type dopant, such as boron or gallium. In yet another embodiment, the source and drain 206 include light doped drain (LDD) and heavily doped features, as shown in FIG. 2.

The method 100 proceeds to step 106 by forming an interlayer dielectric (ILD) 230 on the substrate. The ILD 230 is deposited by a proper technique, such as CVD. The ILD 230 includes a dielectric material, such as silicon oxide, low k dielectric material or a combination. A chemical mechanical polishing (CMP) process may be applied thereafter to planarize the surface of the ILD 230.

The method 100 proceeds to step 108 by removing the polysilicon layer 220, resulting a gate trench. The polysilicon is removed by a suitable etching process, such as wet etch. At step 110, a metal gate stack is formed in the gate trench, which is discussed in greater detail below with reference to FIGS. 3-5.

Figure 3:
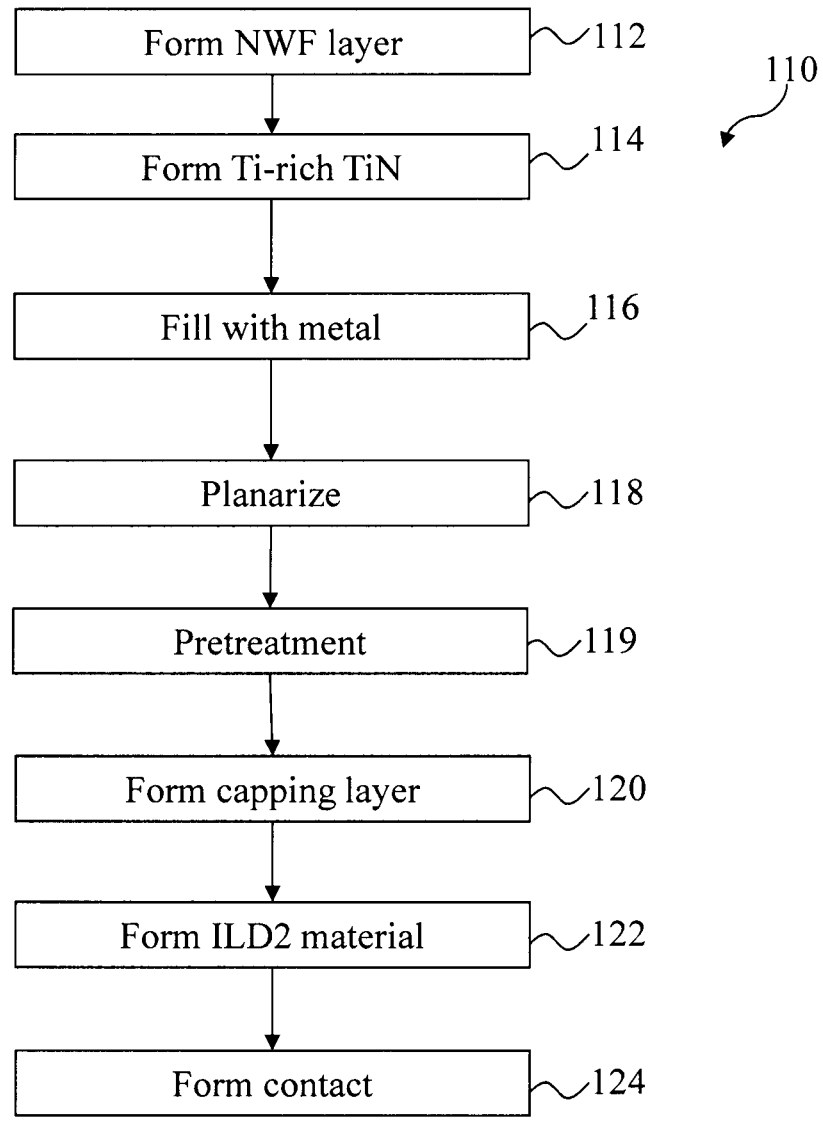
Figure 4:
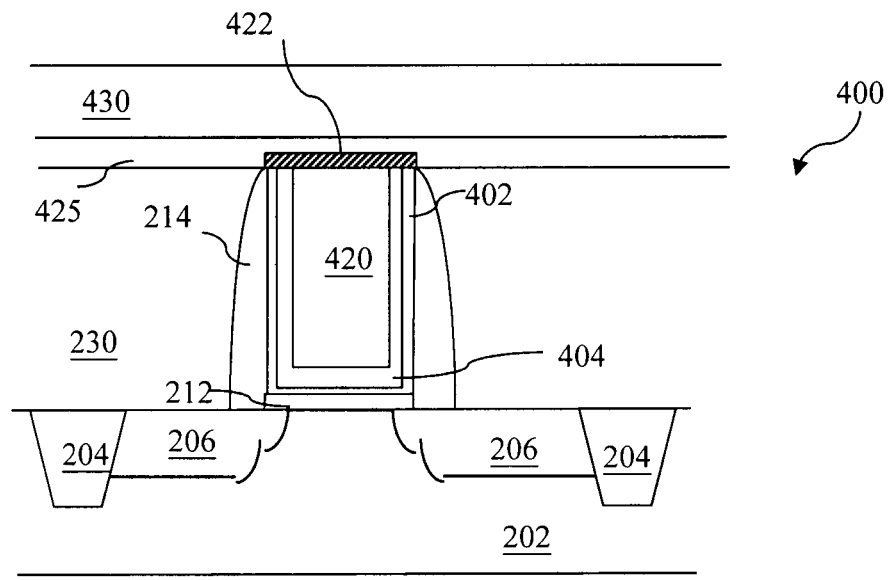

Referring to FIG. 3, at step 112 a first metal layer 402 is formed having a proper work function. The first metal is also referred to as work function metal. For an nFET, the first metal 402 has a work function substantially equals to or less than about 4.4 eV, referred to as n metal. For a pFET, the first metal 402 has a work function substantially equals to or greater than about 4.8 eV, referred to as p metal. In the present example, an n metal work function (NWF) layer is formed, and includes tantalum or titanium aluminum. In another example, the p metal includes titanium nitride or tantalum nitride. The work function metal 402 is deposited by a suitable technique. In the present embodiment, the NWF is deposited by PVD.

At step 114, a blocking layer 404 is formed above the work function metal. Continuing with the example above, the blocking layer is a TiN layer. In the present embodiment, the TiN is deposited by PVD.

At step 116, a fill metal material 420 is deposited in the trench, above the blocking layer 404. In the present embodiment, the fill metal material 420 includes aluminum, although it is understood that other embodiments may be provided, such as aluminum copper alloy. The fill metal material 420 is deposited by a suitable technique, such as PVD or plating.

At step 118, the metal gate is planarized. In one embodiment, a CMP process is applied to remove the excessive metals, including any metals disposed on the ILD 230. The combination of the layers 402, 404, and 420 form a replacement metal gate for the trench left over from the polysilicon dummy gate 220 (FIG. 2). It is understood that additional layers may also be included in the replacement metal gate.

At step 119, a protection layer 422 is formed over the replacement metal gate. In the present embodiment, the protection layer 422 is a metal oxide layer, formed by combining metal from the replacement metal gate with oxygen. In other embodiments, the protection layer 422 may be another suitable layer, such as metal nitride.

Continuing with the present embodiment, the metal oxide protection layer 422 is formed in the same processing chamber (in-situ) as a later-formed contact etch stop layer (CESL), discussed below. In this way, forming the protection layer 422 is a pre-treatment to forming the CESL, and the processing steps used in the pre-treatment are consistent or applicable to those used when forming the CESL. It is understood that in other embodiments, the protection layer 422 can be performed in a different processing chamber (ex-situ) as the later-formed CESL.

For example, the device 400 is heated to a temperature of about 400° C., which in the present example, is the same temperature that the device would be preheated to for forming the CESL. Before the CESL is formed, one or more oxidation gases are introduced into the processing chamber. Example oxidation gases include O2, N2O, and O3. The oxidation gas reacts with the above-described layers 402, 404, and 420 that form the replacement metal gate. The result of the reaction is the metal oxide layer protection layer 422. As mentioned above, in one example, the replacement gate stack includes aluminum. In this example, the protection layer includes aluminum oxide (Al2O3).

At step 120, a capping layer is formed over the protection layer 422. In the present embodiment, a non-silane oxide layer 425 is deposited on the replacement metal gate, such as by chemical vapor deposition (CVD) or atomic layer deposition (ALD).

At step 122, a second ILD 430 is formed on the substrate. The ILD 430 is deposited by a proper technique, such as CVD or spin-on glass. The ILD 430 includes a dielectric material, such as silicon oxide, low k dielectric material or a combination. A chemical mechanical polishing (CMP) process may be applied thereafter to planarize the surface of the ILD 430.

Figure 5:
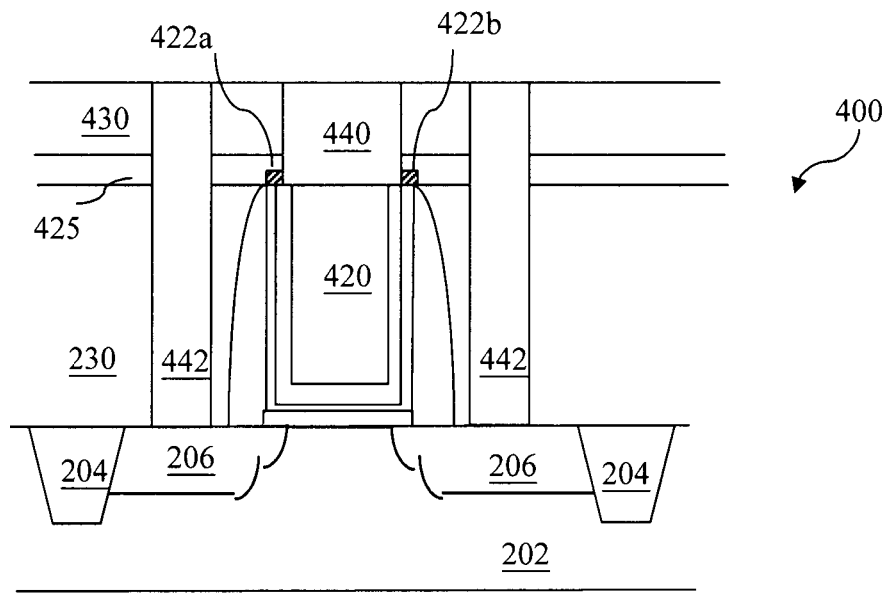

At step 124, a contact 440 is formed in the second ILD 430, to the replacement metal gate. Contacts 442 are also formed in the second ILD 430 that extend down to the source/drain regions 206. In the present embodiment, the contacts 440 and 442 are formed by first forming a contact opening in the second ILD 430 by lithography and etching. For the contact 440, the etching proceeds to the CESL 425 and proceeds through the protection layer 422. However, and as shown in FIG. 5, portions of the protection layer exist, designated as portions 422a and 422b, on either side of the opening for contact 440. The openings for contacts 440, 442 are then filled, such as with a barrier layer (e.g., TiN), and a conductive plug (e.g., W).

Other processing steps may follow to form a functional circuit. For example, a silicide process is used for the contacts 442. Also, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure.

The present disclosure is not limited to applications in which the semiconductor structure includes a field effect transistor, such as a metal-oxide-silicon (MOS) transistor, and may be extended to other integrated circuit having a metal gate stack. For example, the semiconductor structure 400 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The present disclosure provides a structure, such as a metal oxide semiconductor field effect transistor, and methods of forming the same. According to one embodiment, a structure includes a semiconductor substrate and a first interlayer dielectric (ILD) over the semiconductor substrate. A gate structure is formed within the ILD and disposed on the semiconductor substrate, wherein the gate structure includes a high-k dielectric material layer and a metal gate stack. One or more portions of a protection layer are formed over the gate stack, and a contact etch stop layer is formed over the first ILD and over the one or more portions of the protection layer. In some embodiments, the metal gate stack includes aluminum and the protection layer includes aluminum oxide.

In one embodiment, a method of forming a semiconductor structure includes forming a metal gate stack over a substrate and forming a protection layer over the metal gate stack. An etch stop layer is deposited over the protection layer, and an interlayer dielectric is deposited over the etch stop layer. The method further includes forming a contact through the interlayer dielectric, through the etch stop layer, through the protection layer, and to the metal gate stack.

In another embodiment, a method of making a metal oxide semiconductor field effect transistor includes forming a high-k dielectric over a substrate and forming a polysilicon gate over the high-k dielectric. A first interlayer dielectric (ILD1) is deposited over the substrate and around the polysilicon gate. After depositing the ILD1, the polysilicon gate is removed to leave a gate trench. A metal gate stack is then formed in the gate trench, the metal gate stack including a plurality of metal layers. The ILD1 and the metal gate stack are planarized, and a protection layer is formed over the planarized metal gate stack. An etch stop layer is then formed over the ILD1 and the protection layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a semiconductor substrate;
a first interlayer dielectric (ILD) over the semiconductor substrate;
a gate structure formed within the first ILD and disposed on the semiconductor substrate, wherein the gate structure includes a high-k dielectric material layer and a metal gate stack;
a protection layer disposed over the metal gate stack, wherein the protection layer is a metal oxide layer;
a contact etch stop layer formed over the first ILD and over the protection layer, wherein the contact etch stop layer physically contacts the first ILD, wherein the metal oxide layer is embedded within the contact etch stop layer; and
a contact extending through the contact etch stop layer, through the protection layer, and to the metal gate stack.

2. The semiconductor structure of claim 1, wherein the metal gate stack includes aluminum and the metal oxide layer includes aluminum oxide.

3. The semiconductor structure of claim 1, wherein the metal oxide layer includes one or more metals from metal gate stack.

4. The semiconductor structure of claim 3, wherein the contact etch stop layer includes a non-silane based oxide.

5. The semiconductor structure of claim 1, wherein the gate stack further has a work function metal film that includes an n-metal.

6. The semiconductor structure of claim 1, wherein the structure is part of an nFET, and further comprises:
source and drain regions in the substrate, on either side of the gate stack.

7. The semiconductor structure of claim 6, wherein the nFET further comprises contacts to the source and drain regions, and a gate contact to the metal gate stack, adjacent the one or more portions of the protection layer.

8. The semiconductor structure of claim 1, wherein the first ILD has a bottom surface facing the semiconductor substrate and a top surface facing away from the semiconductor substrate,
wherein the metal gate stack has a top surface facing away from the semiconductor substrate that is substantially coplanar with the top surface of the first ILD, and
wherein the protection layer has a bottom surface facing the semiconductor substrate that is substantially coplanar with the top surface of the first ILD.

9. The semiconductor structure of claim 1, wherein the gate structure includes a work function metal layer and a fill metal layer, and
wherein the metal oxide layer physically contacts the work function metal layer and does not physically contact the fill metal layer.

10. The semiconductor structure of claim 1, wherein the work function metal layer has opposing sidewall surface that define a recess therebetween, and
wherein the fill metal layer is disposed within the recess.

11. The semiconductor structure of claim 1, further comprising a sidewall spacer formed of a first material and disposed along a sidewall of the gate structure, and
wherein the metal oxide layer is formed of a different material than the first material.

12. A method of forming a semiconductor structure, comprising:
forming a metal gate stack over a substrate;
forming a protection layer over the metal gate stack, wherein the protection layer is a metal oxide formed by providing an oxidation treatment to the metal gate, wherein the protection layer is formed by introducing an oxide gas into a chamber containing the semiconductor structure, whereby the oxide gas interacts with metal in the metal gate to form the protection layer;
depositing an etch stop layer over the protection layer;
depositing an interlayer dielectric over the etch stop layer; and
forming a contact through the interlayer dielectric, through the etch stop layer, through the protection layer, and to the metal gate stack.

13. The method of claim 12, wherein the protection layer is formed in-situ with the deposition of the etch stop layer.

14. The method of claim 12, further comprising:
forming source and drain regions in the substrate; and
forming source and drain contacts through the interlayer dielectric, through the etch stop layer, and to the source and drain regions, respectively.

15. The method of claim 12, wherein the metal gate includes aluminum and the protection layer includes aluminum oxide (Al2O3).

16. The method of claim 12, wherein the chamber is also used for depositing the etch stop layer.

17. The method of claim 12, wherein the oxide gas includes at least one from the group consisting of O2, N2O, and O3.

18. A method of making a metal oxide semiconductor field effect transistor, comprising:
- forming a high-k dielectric over a substrate;
- forming a polysilicon gate over the high-k dielectric;
- depositing a first interlayer dielectric (ILD1) over the substrate and around the polysilicon gate;
- after depositing the ILD1, removing the polysilicon gate to leave a gate trench;
- forming a metal gate stack in the gate trench, the metal gate stack including a plurality of metal layers;
- planarizing the ILD1 and the metal gate stack;
- forming a protection layer over the planarized metal gate stack, wherein the protection layer includes a metal oxide layer;
- forming an etch stop layer over the ILD1 and the protection layer; and
- forming a contact through the etch stop layer, through the protection layer, and to the metal gate stack.

19. The method of claim 18, wherein the metal gate stack includes aluminum and the metal oxide layer includes aluminum oxide.

20. The method of claim 18, wherein forming the protection layer over the planarized metal gate stack includes introducing an oxide gas such that the oxide gas interacts with metal in the metal gate to form the metal oxide layer.

\* \* \* \* \*